United States Patent
Tsai et al.

(10) Patent No.: US 9,601,443 B2
(45) Date of Patent: Mar. 21, 2017

(54) TEST STRUCTURE FOR SEAL RING QUALITY MONITOR

(75) Inventors: Hao-Yi Tsai, Hsin-Chu (TW); Shih-Hsun Hsu, Hsin-Chu (TW); Shih-Cheng Chang, Hsin-Chu (TW); Shang-Yun Hou, Jubei (TW); Hsien-Wei Chen, Sinying (TW); Chia-Lun Tsai, Hsin-Chu (TW); Benson Liu, Taipei (TW); Shin-Puu Jeng, Hsin-Chu (TW); Anbiarshy Wu, Chiayi (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 1805 days.

(21) Appl. No.: 11/706,940

(22) Filed: Feb. 13, 2007

(65) Prior Publication Data

US 2008/0191205 A1 Aug. 14, 2008

(51) Int. Cl.
*H01L 21/66* (2006.01)
*H01L 23/48* (2006.01)
*H01L 23/58* (2006.01)
*H01L 23/00* (2006.01)

(52) U.S. Cl.
CPC ............ *H01L 23/585* (2013.01); *H01L 22/34* (2013.01); *H01L 24/11* (2013.01); *H01L 2224/05548* (2013.01); *H01L 2224/05573* (2013.01); *H01L 2224/05624* (2013.01); *H01L 2224/05639* (2013.01); *H01L 2224/05647* (2013.01); *H01L 2224/05684* (2013.01); *H01L 2224/45147* (2013.01); *H01L 2224/48091* (2013.01); *H01L 2924/14* (2013.01)

(58) Field of Classification Search
USPC ............... 257/620, 675, E21.523, 706, 758, 257/E23.137; 438/122, 462
See application file for complete search history.

(56) References Cited

U.S. PATENT DOCUMENTS

| | | | |
|---|---|---|---|
| 6,861,754 B2 * | 3/2005 | Lin et al. ...................... | 257/758 |
| 6,951,801 B2 * | 10/2005 | Pozder et al. ................ | 438/462 |
| 7,250,311 B2 * | 7/2007 | Aoki ...................... | H01L 22/34 |
| | | | 257/781 |
| 7,256,475 B2 * | 8/2007 | Jao et al. ...................... | 257/622 |
| 7,453,128 B2 * | 11/2008 | Tsutsue et al. ............... | 257/409 |
| 7,622,364 B2 * | 11/2009 | Adkisson .............. | H01L 23/562 |
| | | | 257/620 |

(Continued)

*Primary Examiner* — Eva Y Montalvo
*Assistant Examiner* — David Goodwin
(74) *Attorney, Agent, or Firm* — Slater Matsil, LLP

(57) ABSTRACT

A semiconductor structure includes a daisy chain adjacent to an edge of a semiconductor chip. The daisy chain includes a plurality of horizontal metal lines distributed in a plurality of metallization layers, wherein the horizontal metal lines are serially connected; a plurality of connecting pads in a same layer and electrically connecting the horizontal metal lines, wherein the connecting pads are physically separated from each other; and a plurality of vertical metal lines, each connecting one of the connecting pads to one of the horizontal metal lines, wherein one of the plurality of connecting pads is connected to one of the plurality of horizontal metal lines by only one of the plurality of vertical metal lines; and a seal ring adjacent and electrically disconnected from the daisy chain.

20 Claims, 8 Drawing Sheets

(56) References Cited

U.S. PATENT DOCUMENTS

| | | | |
|---|---|---|---|
| 7,649,200 B1* | 1/2010 | Miller | H01L 22/34 |
| | | | 257/415 |
| 7,791,070 B2* | 9/2010 | Huang et al. | 257/48 |
| 2006/0001144 A1* | 1/2006 | Uehling et al. | 257/690 |

* cited by examiner

TEST STRUCTURE FOR SEAL RING QUALITY MONITOR

TECHNICAL FIELD

This invention relates to the manufacture of semiconductor chips having low-k dielectric materials, and more particularly to structures and methods for determining the quality of semiconductor chips.

BACKGROUND

Integrated circuits (IC) manufacturers are employing finer circuit widths, low dielectric constant (low-k) materials, and other technologies to make small, high-speed semiconductor devices. Along with these advancements, the challenges of maintaining yield and throughput have also increased. With regard to reliability, the presence of low-k materials near die corners increases the chances of crack formations, especially in the sawing process.

A semiconductor wafer typically comprises isolated dies (or chips) separated from each other by scribe lines. Individual dies within the wafer contain circuitry, and the dies are separated by sawing. A typical problem is that the low-k dielectric materials in dies are prone to damage incurred by stress introduced by the sawing process. When cracks form in low-k dielectric materials, copper lines in the low-k dielectric materials may be damaged.

Conventionally, dies may be inspected after the sawing process using an optical microscope (OM). However, OM inspection is objective, and hence is unreliable. Particularly, it is difficult to differentiate whether the damage is a backside chipping of the semiconductor die or an inter-metal dielectric (IMD) crack. The backside chipping can be easily solved by adjusting the sawing process, while the cracking of low-k dielectric materials is a much harder issue to solve. Without being able to reliably identify the root cause of the problem, it is hard to determine the action to be taken. What is needed, therefore, is a mean for reliably determining the quality of dies after sawing processes.

SUMMARY OF THE INVENTION

In accordance with one aspect of the present invention, a semiconductor structure includes a daisy chain adjacent to an edge of a semiconductor chip. The daisy chain includes a plurality of horizontal metal lines distributed in a plurality of metallization layers, wherein the horizontal metal lines are serially connected; a plurality of connecting pads in a same layer and electrically connecting the horizontal metal lines, wherein the connecting pads are physically separated from each other; and a plurality of vertical metal lines, each connecting one of the connecting pads to one of the horizontal metal lines, wherein one of the plurality of connecting pads is connected to one of the plurality of horizontal metal lines by only one of the plurality of vertical metal lines; and a seal ring adjacent and electrically disconnected from the daisy chain.

In accordance with another aspect of the present invention, a semiconductor structure includes a semiconductor chip comprising a semiconductor substrate; a test structure adjacent to, and extending substantially along, all edges of the semiconductor chip, wherein the test structure comprises a plurality of serially connected test units, and wherein each of the test units comprises a plurality of dielectric layers over the semiconductor substrate, each comprising only one of a plurality of metal lines, wherein the metal lines are serially connected, and wherein the metal lines are horizontally spaced apart from each other; a plurality of connecting pads each comprising two horizontally located ends, wherein each of the two ends is electrically connected to one of the metal lines; and a plurality of vertical metal lines, each connecting one and only one of the connecting pads to one and only one of the horizontal metal lines; two bumps on the semiconductor chip, each connected to one of the connecting pads; and a seal ring adjacent the test structure.

In accordance with yet another aspect of the present invention, a semiconductor chip includes a test structure extending along at least one edge of the semiconductor chip, the test structure comprising a plurality of serially connected metal lines, wherein the metal lines are distributed substantially evenly in metallization layers of the semiconductor chip, and wherein each of the metal lines is horizontally spaced apart from neighboring metal lines; a plurality of connecting pads, each electrically connecting only two of the neighboring metal lines; two bumps on the semiconductor chip, wherein each of the two bumps is connected to one of the connecting pads; and a seal ring adjacent the test structure.

The test structures may be used as indicators of the quality of semiconductor chips.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
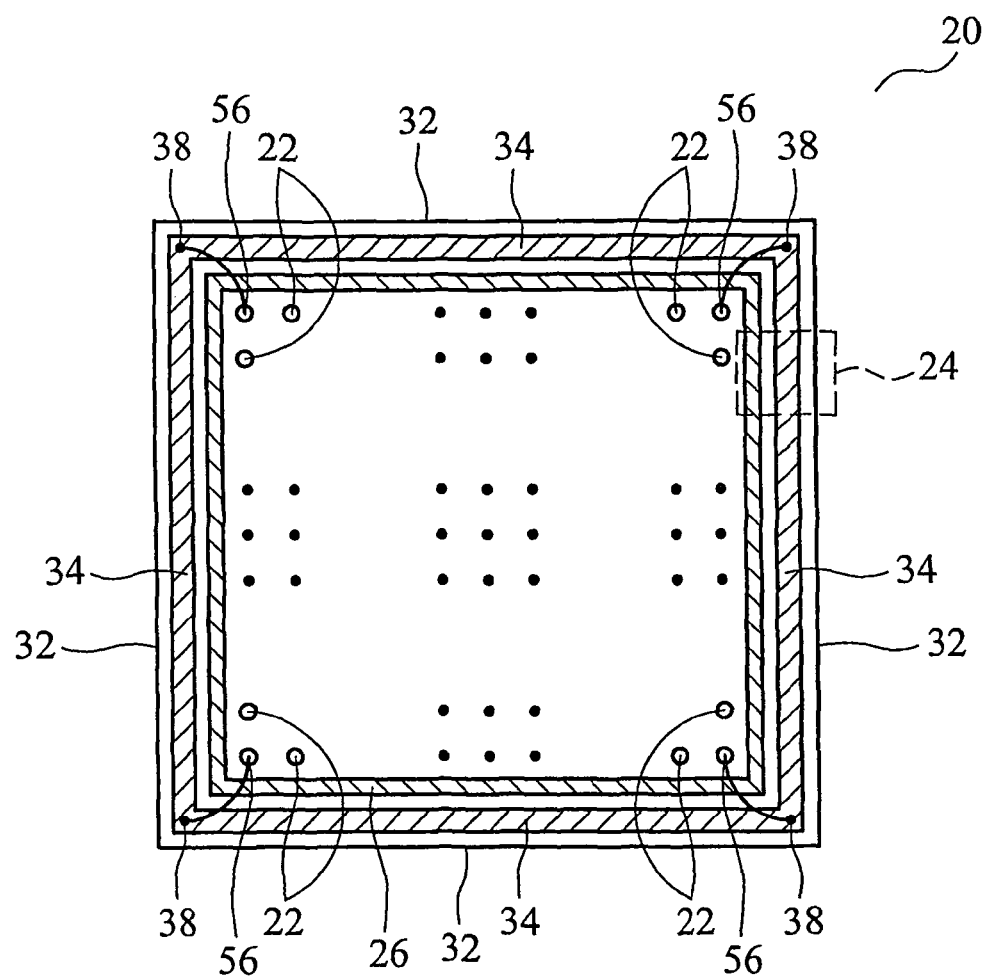
FIG. 1 illustrates a top view of a semiconductor chip, wherein a test structure is formed adjacent to edges of the semiconductor chip.

FIG. 1 illustrates a top view of semiconductor chip 20. A plurality of bumps 22 are formed on the top surface of semiconductor chip 20 and are connected to underlying circuits. Proximate edges 32 of semiconductor chip 20, seal ring 26, also referred to as main seal ring 26 throughout the description, are formed. As is known in the art, seal ring 26 forms a ring surrounding the integrated circuits in semiconductor chip 20, and is formed of metal lines and connecting vias. Since seal ring 26 is a tightly interconnected structure, it not only provides mechanical support to the integrated circuit therein, but also prevents moisture from penetrating through edges of semiconductor chip 20. Optionally, sacrificial seal ring 28, which is between main seal ring 26 and edges 32, may be formed. FIG. 1 also illustrates test structure 34. The details of main seal ring 26, sacrificial seal ring 28 and test structure 34 will be discussed in detail in subsequent paragraphs.

Figure 2:
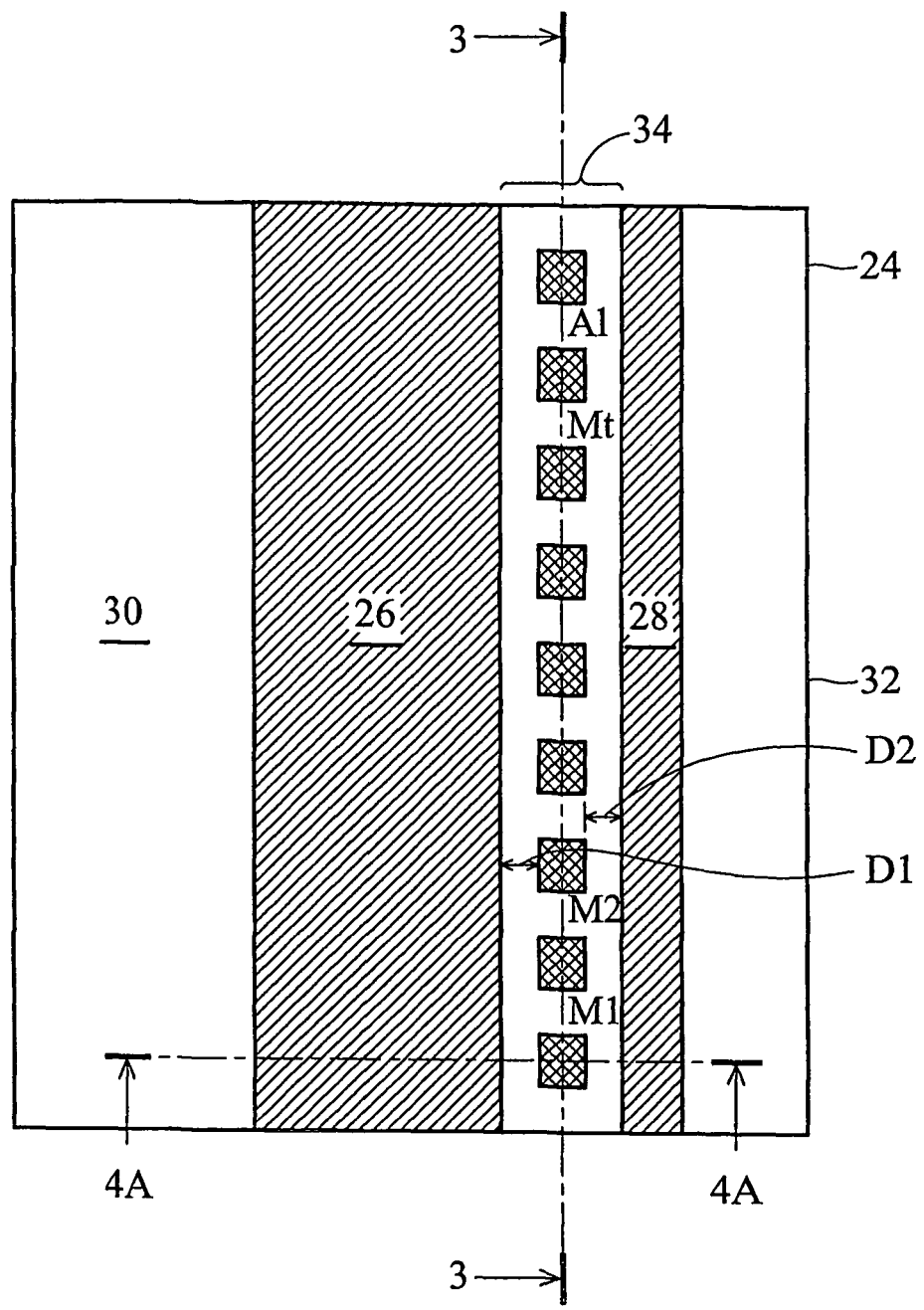
FIG. 2 illustrates a top view of an edge region of the semiconductor chip.

FIG. 2 illustrates a top view of sub-region 24 of the semiconductor chip 20, which includes an edge region of semiconductor chip 20. FIG. 2 schematically illustrates main seal ring 26 adjacent circuit region 30, and sacrificial seal ring 28 adjacent to edge 32 of the semiconductor chip 20.

Test structure 34 is preferably formed between main seal ring 26 and sacrificial seal ring 28. In the preferred embodiment, there is no electrical connection between test structure 34 and seal rings 26 and 28. Test structure 34 is formed of serially interconnected test units, and thus is alternatively referred to as daisy chain 34 throughout the description. The distance D1 between test structure 34 and seal ring 26 is preferably less than about 500 nm. The distance D2 between test structure 34 and sacrificial seal ring 28 is preferably less than about 500 nm.

Figure 3A:
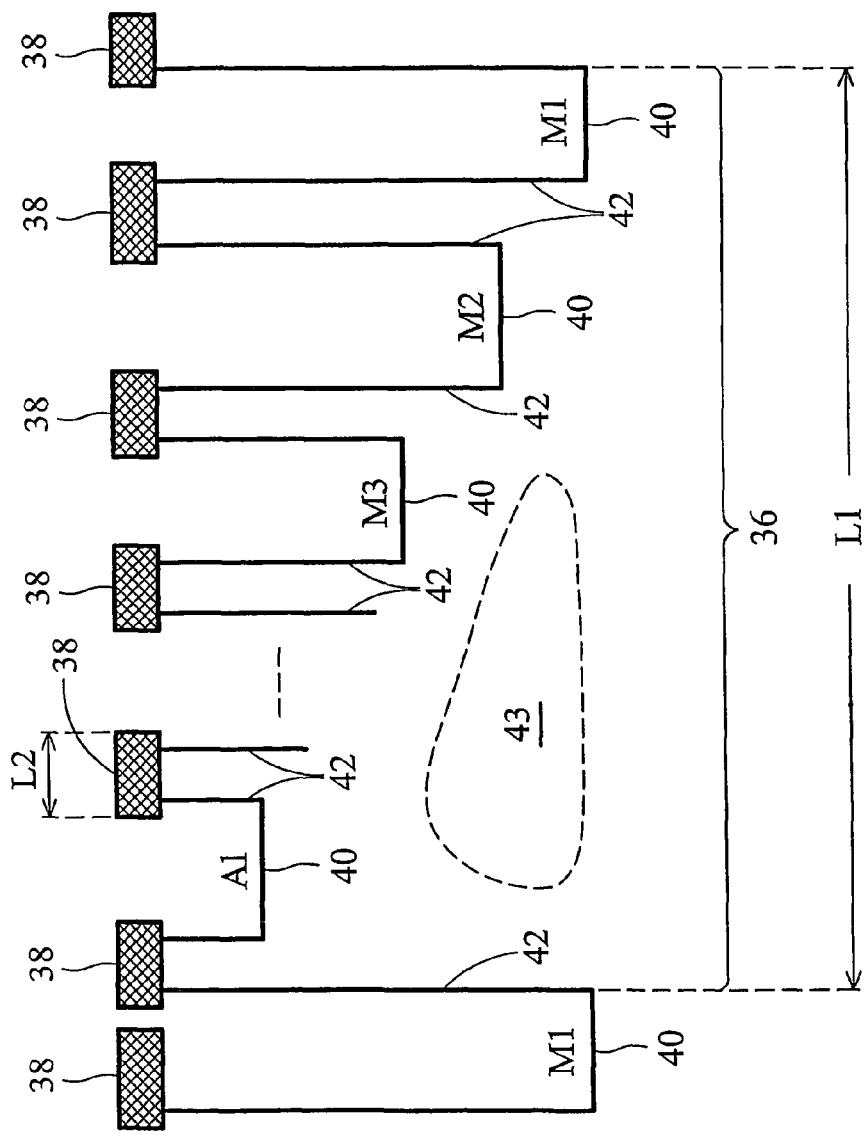
FIGS. 3A through 3C are cross-sectional views of embodiments of the present invention, wherein the cross-sectional views are taken along a plane crossing line 3-3 in FIG. 2.

FIG. 3A illustrates a cross-sectional view of the structure shown in FIG. 2, wherein the cross-sectional view is taken along a plane crossing line 3-3. In the preferred embodiment, test structure 34 is formed by connecting a plurality of test units serially, wherein FIG. 3A illustrates an exemplary test unit 36. In each test unit 36, there is a plurality of connecting pads 38, which are preferably formed in a top layer of the interconnect structure. In an exemplary embodiment, the top layer is an aluminum layer, and connecting pads 38 are aluminum pads, although they can be formed using any commonly used metals, such as copper, tungsten, silver, and combinations thereof. A plurality of horizontal metal lines 40 are formed in dielectric layers over the semiconductor substrate (not shown) of the semiconductor chip. Metal lines 40 are located in metallization layers M1 through Mt and A1, wherein M1 indicates metallization layer one, Mt indicates top metallization layer, and A1 indicates aluminum pad layer. The dielectric layers preferably comprise low-k dielectric materials with dielectric constants (k value) of less than about 3.5. Preferably, metal lines 40 in a test unit 36 are each in one of the metallization layers, and hence in test structure 34. Metal lines 40 are substantially evenly distributed throughout the metallization layers. In test unit 36, each metallization layer preferably has only one metal line 40. Therefore, the number of metal lines in each test unit 36 is preferably equal to the number of metallization layers. In an exemplary embodiment wherein the interconnect structures include nine metallization layers, there are nine metal lines 40. Alternatively, some of the metallization layers may not have metal lines 40, and thus the number of metal lines 40 is less than the number of metallization layers.

Connecting pads 38 are serially connected by metal lines 40 and vertical conductive lines 42. For simplicity purpose, vertical conductive lines 42 are illustrated as straight lines, one skilled in the art will realize that each vertical conductive lines 42 includes metal pads in metallization layers, and vias connecting the metal pads (refer to FIG. 4A). Therefore, from a connecting pad 38 at one end of test unit 36 to another connecting pad 38 at the other end of test unit 36, there exists an electrical path. In the preferred embodiment, only one electrical path is formed between two end connecting pads 38, and thus if one of the metal lines 40 and/or vertical conductive lines 42 is broken, the electrical connection between the two end connecting pads 38 is also broken.

Figure 3B:
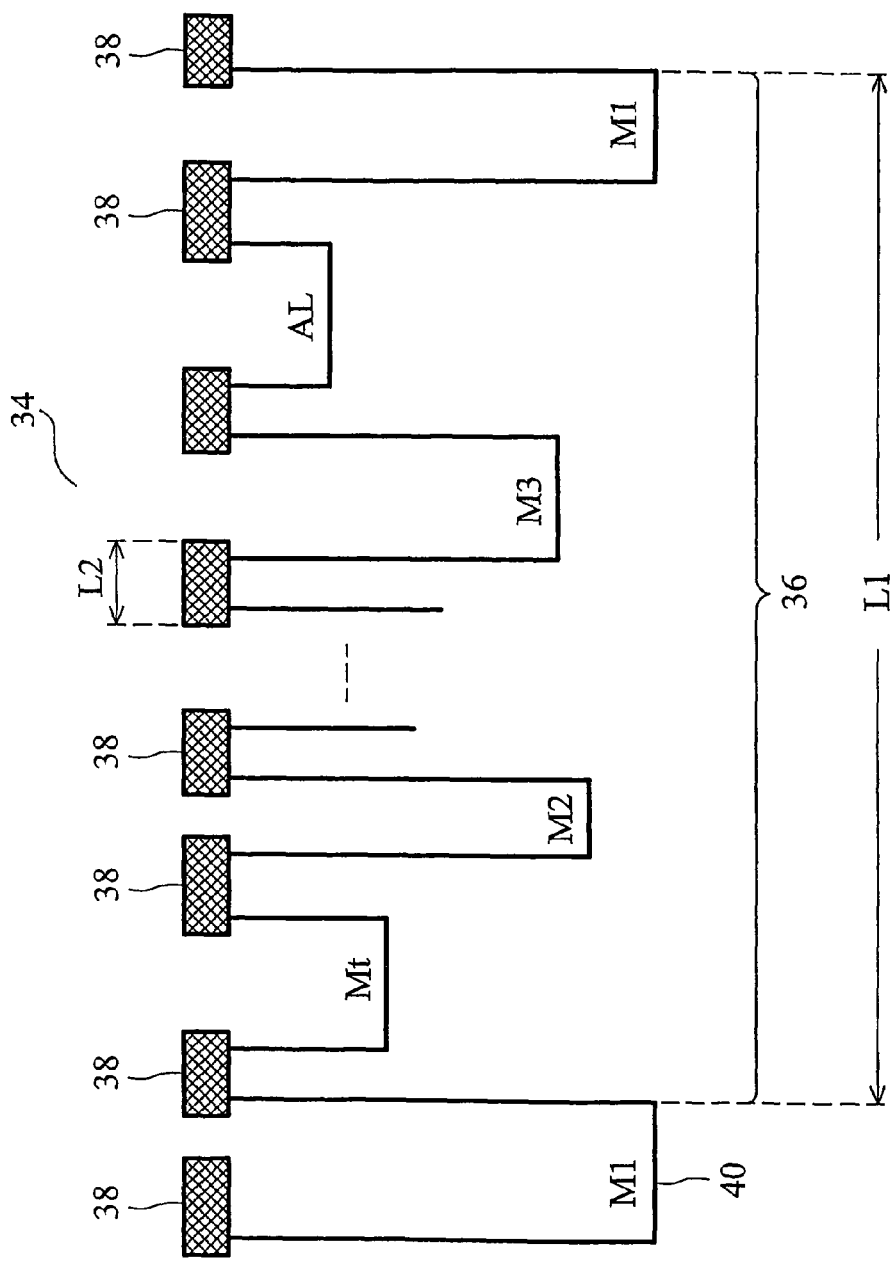

In one exemplary embodiment, vertical conductive lines 42 are arranged according to their lengths in ascending or descending order, as is shown in FIG. 3A. In other exemplary embodiments, long vertical conductive lines 42 and short vertical conductive lines 42 are placed in an alternating pattern, as illustrated in FIG. 3B. An advantageous feature of such an arrangement is that it can prevent the formation of regions with relatively great size, such as region 43 in FIG. 3A. If cracks are formed in regions 43, they will not be detected. In yet other embodiments, vertical conductive lines 42 are placed in a random order regardless of their lengths.

Test structure 34 may be used to determine whether the low-k dielectric materials have cracks or not. If low-k dielectric layers have cracks, metal lines 40 (and even vertical conductive lines 42) are likely to break. Therefore, by testing whether the electrical connection between the two end connecting pads 38 is open or not, the quality of low-k dielectric layers may be determined. Accordingly, metal lines 40 preferably have small widths, so that it can be easily broken when the low-k dielectric layer cracks.

The optimal length L1 of test unit 36 is preferably determined based on the cracking length that may occur during the sawing process. In the preferred embodiment, length L1 is less than about ⅕ of an average crack length, which may be determined by measuring cracked wafers. It is realized that the optimal length L1 is related to the scale of the integrated circuits. When the scale of the integrated circuits decreases, length L1 needs to be reduced accordingly. Length L2 of connecting pads 38, on the other hand, is preferably as small as possible, providing the size of each connecting pads 38 is big enough for connecting two vertical conductive lines 42.

Figure 3C:
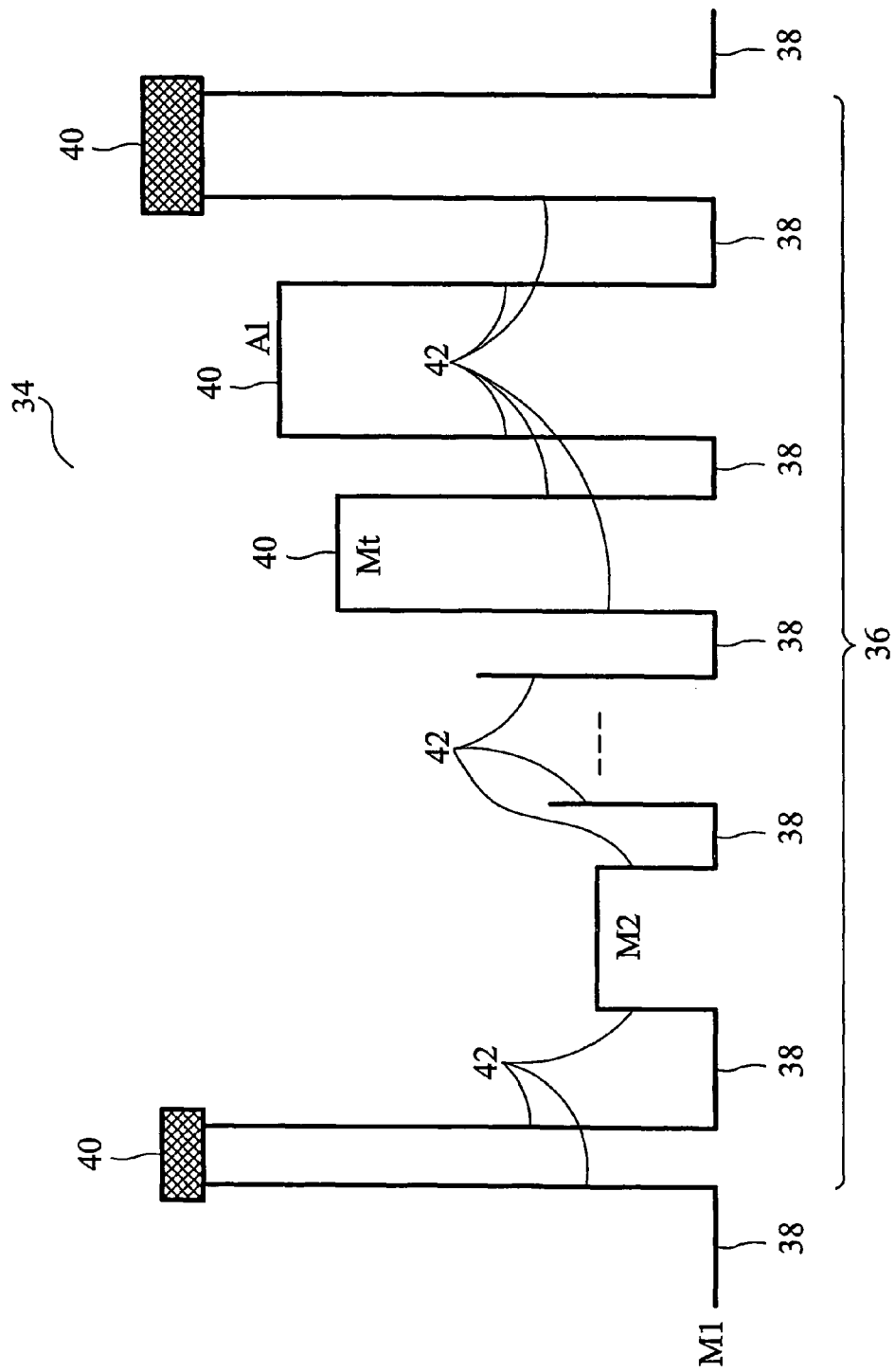

FIG. 3C illustrates an alternative embodiment of the present invention, wherein connecting pads 38 are formed in metallization layer one (M1), and vertical conductive lines 42 each extends from M1 to a metal line 40 in an overlying metallization layer, including the aluminum pad layer. In yet other embodiments, connecting pads 38 may be formed in any of the intermediate metallization layers.

Figure 4A:
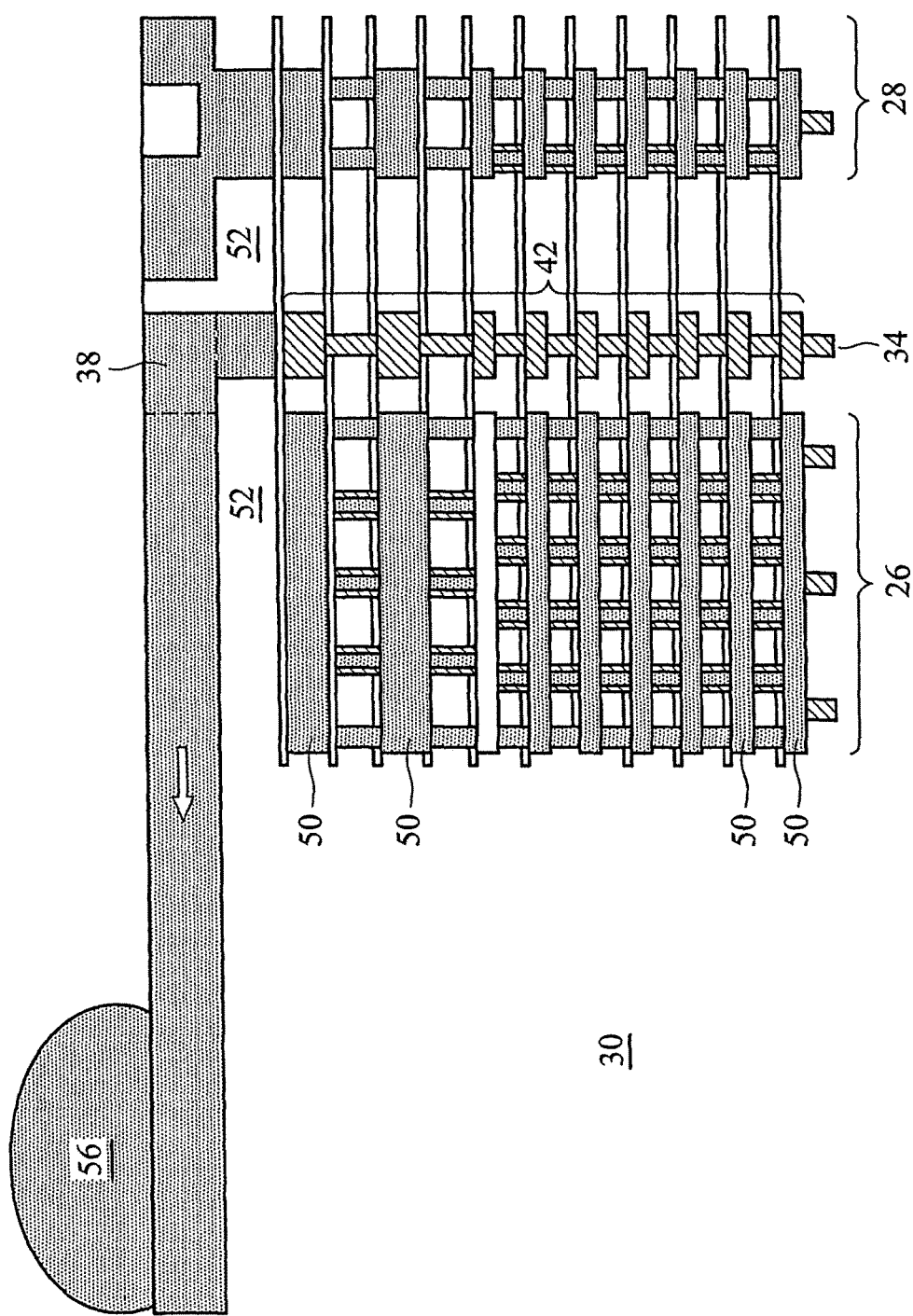
FIG. 4A illustrates a cross-sectional view of the structure shown in FIG. 2, wherein the cross-sectional view is taken along a plane crossing line 4A-4A, and wherein the cross-sectional view shows a test structure is formed between a main seal ring and a sacrificial seal ring.

FIG. 4A illustrates a cross-sectional view of the structure shown in FIG. 2, wherein the cross-sectional view is taken along a plane crossing line 4A-4A, and thus a vertical line 42 is shown. FIG. 4A illustrates that main seal ring 26 includes a plurality of metal pads 50, each in a metallization layer. Each of the metal pads 50 is connected to an overlying and/or an underlying metal pad by a plurality of vias. Each of the metal pads 50 preferably form a ring extending along edges of the respective semiconductor chip. Passivation layer 52 is formed over the top metallization layer.

Metal pads and connecting vias of test structure 34 are preferably formed simultaneously with the formation of the respective metal pads 50 and the connecting vias. In the exemplary embodiment shown in FIG. 4A, connecting pads 38 are formed in the aluminum pad layer. Some, but not all, of the connecting pads 38 may be connected to solder bumps 56 that are formed on the surface of semiconductor chip 20. Sacrificial seal ring 28 is also formed. Sacrificial seal ring 28 is optional, and may be omitted in other embodiments.

In the preferred embodiment, test structure 34 is formed on an outer side of main seal ring 26. An advantageous feature of such a layout is that test structure 34 may be used to test whether main seal ring 26 has been damaged or not. Since test structure 34 is closer to the scribe line (not shown)

than main seal ring 26, a greater stress, which is generated by the sawing process, is applied on test structure 34 than on main seal ring 26. If test structure 34 on a semiconductor chip is not damaged, it indicates that main seal ring 26 is not damaged, and the integrated circuits on the inner side of main seal ring 26 are not damaged. Therefore, the semiconductor chip can be packaged. Conversely, if test structure 34 on a semiconductor chip is damaged, the main seal ring 26 and the integrated circuits on the inner side of the main seal ring may or may not be damaged. Since the cost of packaging a possibly damaged chip cannot be justified, the semiconductor chip should be scraped. In FIG. 4A, test structure 34 is used as a quality monitor for both main seal ring 26 and the integrated circuits formed in region 30.

Figure 4B:
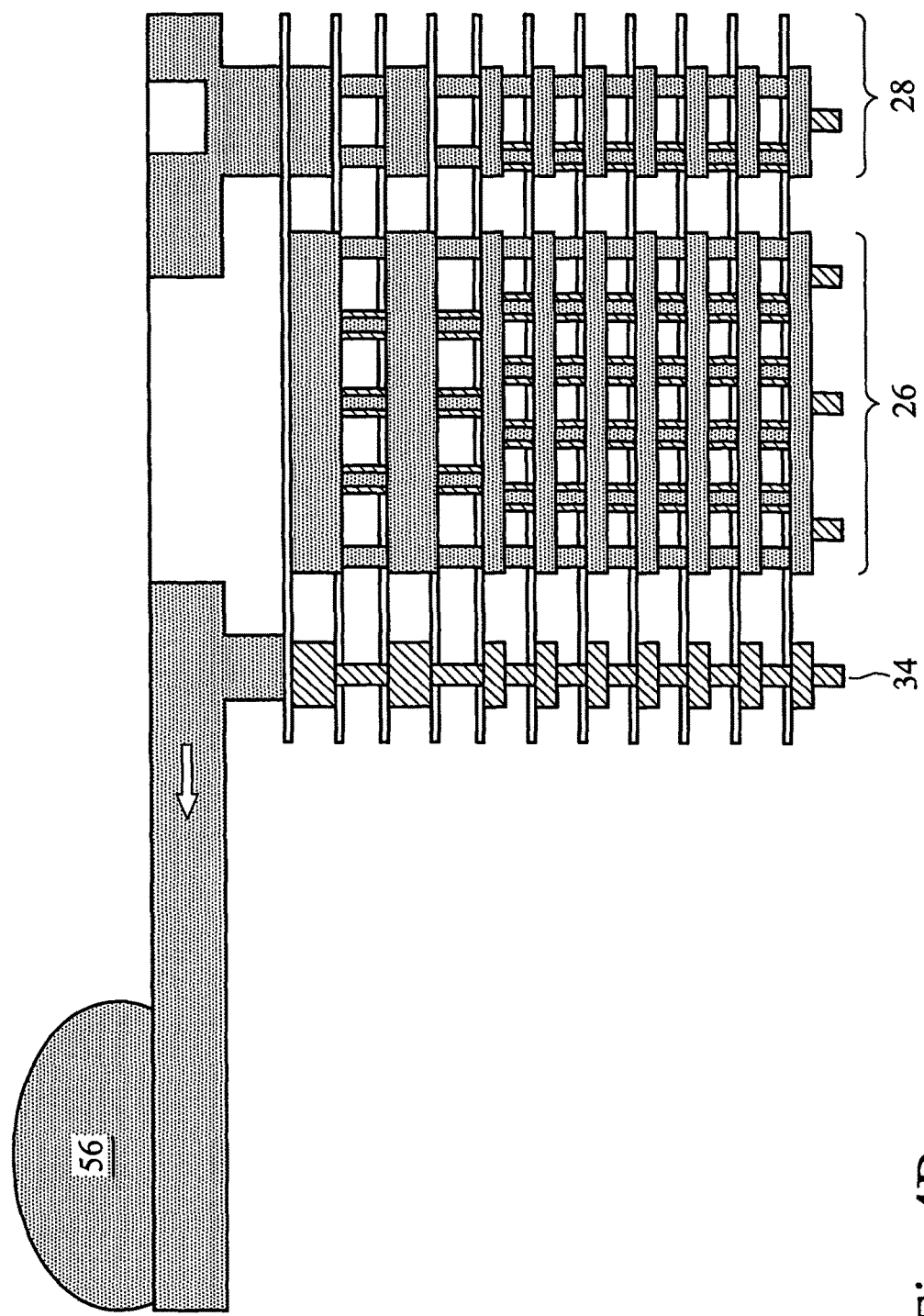
FIG. 4B illustrates a variation of the embodiment shown in FIG. 4A, wherein a main seal ring is formed between a test structure and a sacrificial seal ring.

Referring to FIG. 4B, in alternative embodiments, test structure 34 may be placed on an inner side of main seal ring 26. In this case, if test structure 34 on a semiconductor chip is damaged, it indicates that main seal ring 26 is also damaged. The integrated circuits on the inner side of test structure may or may not be damaged. The semiconductor chip should be scraped. Conversely, if test structure 34 on a semiconductor chip is not damaged, the main seal ring 26 may or may not be damaged. However, the integrated circuits on the inner side of test structure 34 are not damaged. Therefore, the semiconductor chip can be packaged. In FIG. 4B, test structure 34 is used as a quality monitor for the integrated circuits in region 30, but not for main seal ring 26.

Referring back to FIG. 1, by serially connecting a plurality of test units 36 (refer to FIGS. 3A through 3C) along the edges of semiconductor chip 20, test structure 34 is formed, wherein test structure 34 is a daisy chain. In an embodiment, the daisy chain is a closed loop. To determine the connection status of the daisy chain 34, a corner solder bump 56 at each corner of semiconductor chip 20 is connected to one of the connecting pads 38 adjacent the corners (refer to FIGS. 3A through 3C). It is realized that any of the bumps may be used to connect to connecting pads 38. However, corner bumps are typically dummy bumps due to high stress at corners of semiconductor chip, and thus are suitable for testing purpose. Therefore, by determining the connection between the corner solder bumps 56, the status of metal lines in daisy chain 34 may be determined. Accordingly, it can be determined whether low-k dielectric layers have cracks or not.

Figure 5A:
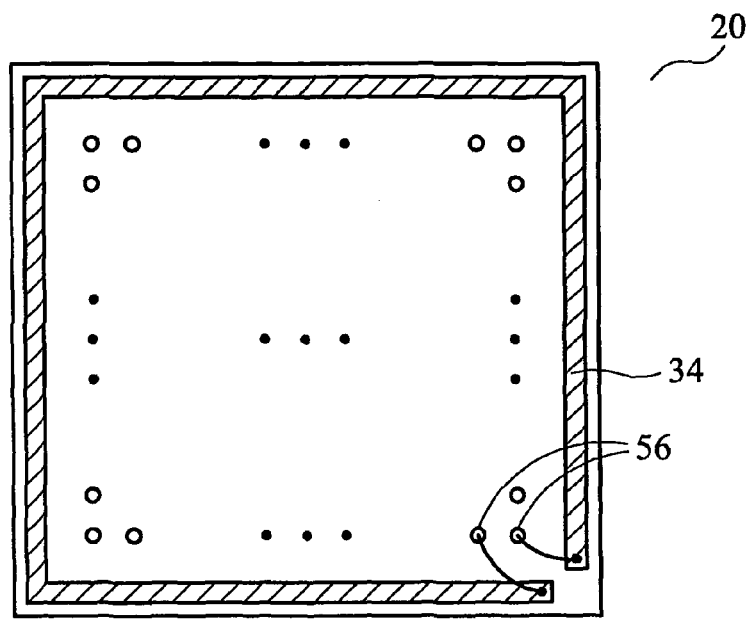
FIGS. 5A and 5B illustrate alternative embodiments of the present invention.
Figure 5B:
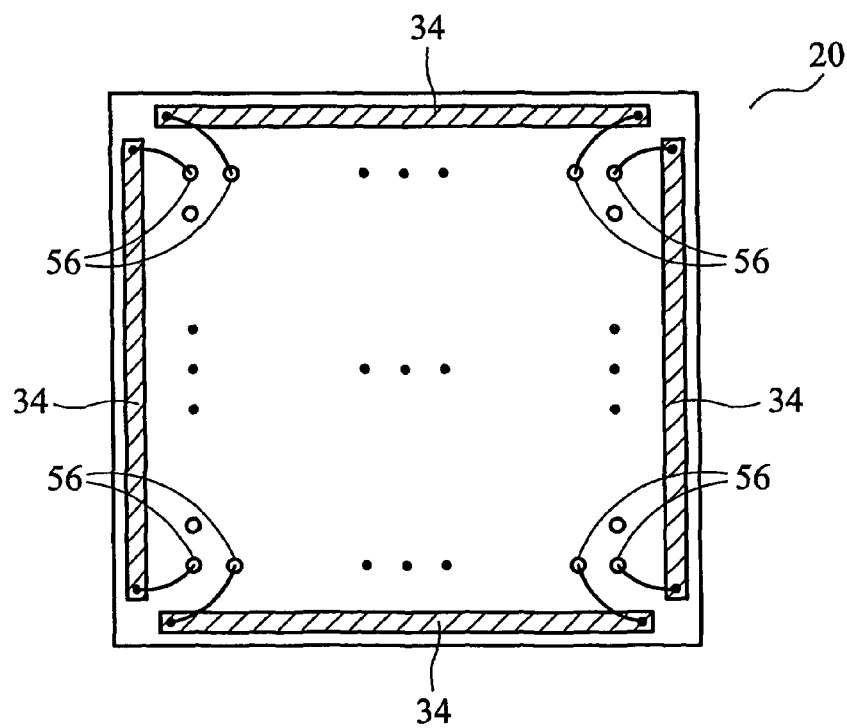

It is noted that in FIG. 1, between any of the two corner bumps 56, there are two electrical paths. If only one of the electrical paths is broken while the other stays intact, the connection between the tested corner solder bumps 56 will still be detected, which leads to an erroneous determination. FIG. 5A illustrates an alternative embodiment, wherein only one electrical path exists. For simplicity, seal rings are not illustrated. In this case, test structure 34 is an open daisy chain, with all test units serially connected. Preferably, two solder bumps 56 are connected to the two ends of test structure 34. In other embodiments, test structure 34 may have more than one disconnected portion. FIG. 5B illustrates an exemplary embodiment, wherein at each edge of semiconductor chip 20, there is a daisy chain having two ends, each connected to one solder bump 56.

It is realized that the test structure 34 may be formed of various forms of daisy chains besides the embodiments shown in FIGS. 1, 5A and 5B. Also, the test units may have a same structure, or may have different structures and lengths.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a daisy chain adjacent an edge of a semiconductor chip, the daisy chain comprising:
      a plurality of horizontal metal lines distributed in a plurality of metallization layers, wherein the horizontal metal lines are serially connected;
      a plurality of connecting pads in a same layer and electrically connecting the horizontal metal lines, wherein the plurality of connecting pads are physically separated from each other; and
      a plurality of vertical metal lines, each connecting one of the plurality of connecting pads to one of the horizontal metal lines, wherein one of the plurality of connecting pads is connected to one of the plurality of horizontal metal lines by only one of the plurality of vertical metal lines;
   a seal ring adjacent to and electrically disconnected from the daisy chain, wherein the seal ring comprises a side parallel to a respective side of the daisy chain, and wherein the seal ring is on an inner side of the daisy chain;
   two bumps on the semiconductor chip, wherein the two bumps are in a region encircled by the seal ring; and
   two metal lines, each being over and crossing the seal ring, wherein each of the two metal lines connects one of the two bumps to the daisy chain.

2. The semiconductor structure of claim 1, wherein the plurality of connecting pads are not vertically overlapped.

3. The semiconductor structure of claim 1, wherein the horizontal metal lines are not vertically overlapped.

4. The semiconductor structure of claim 1, wherein the daisy chain comprises a plurality of test units, each comprising a bottom metal line and two electrical paths connected to opposite ends of the bottom metal line, with the bottom metal line being a bottom-most feature of the respective one of the plurality of test units, and wherein the bottom metal line of each of the plurality of test units is in a different metallization layer than the bottom metal lines in other ones of the plurality of test units.

5. The semiconductor structure of claim 4, wherein in f the plurality of test units, the vertical metal lines are arranged in an order of lengths.

6. The semiconductor structure of claim 4, wherein in the plurality of test units, the vertical metal lines are arranged in an alternating pattern according to lengths of the vertical metal lines.

7. The semiconductor structure of claim 4, wherein all of the plurality of test units extends from a single one of the plurality of metallization layers downwardly.

8. The semiconductor structure of claim 1, wherein the plurality of vertical metal lines each comprises a plurality of metal pads, each in one of the metallization layers, and a plurality of vias connecting the metal pads.

9. The semiconductor structure of claim 1, wherein the daisy chain extends along all edges of the semiconductor chip, and wherein a length of each side of the daisy chain is substantially close to a length of a respective side of the seal ring, with the respective side of the seal ring parallel to the each side of the daisy chain.

10. The semiconductor structure of claim 9, wherein the daisy chain forms a closed loop, and is disconnected from the seal ring.

11. A semiconductor structure comprising:
a semiconductor chip comprising a semiconductor substrate; and
a test structure comprising a plurality of serially connected test units, each comprising:
 a first top metal pad and a second top metal pad, wherein all first top metal pads and all second top metal pads of the plurality of serially connected test units are in a single metallization layer;
 a bottom metal line, wherein the bottom metal line of each of the plurality of serially connected test units is in a different metallization layer than the bottom metal lines in all other ones of the plurality of serially connected test units, and the bottom metal line is a bottom-most feature of a respective one of the plurality of serially connected test units;
 a first vertical electrical path connecting the first top metal pad to a first end of the bottom metal line; and
 a second vertical electrical path connecting the second top metal pad to a second end of the bottom metal line;
two bumps on the semiconductor chip and electrically connected to the test structure; and
a seal ring adjacent to the test structure, wherein the test structure comprises a side having a length substantially equal to or greater than a length of a side of the seal ring, and wherein the test structure comprises a portion between the seal ring and an edge of the semiconductor chip.

12. The semiconductor structure of claim 11 further comprising a sacrificial seal ring between the portion of the test structure and the edge.

13. The semiconductor structure of claim 11 further comprising two additional bumps on the semiconductor chip, wherein the two bumps and the two additional bumps are corner bumps, each at a corner of the semiconductor chip.

14. The semiconductor structure of claim 11, wherein the test structure comprises two sides, each parallel to a side of the seal ring, and wherein each of the sides of the test structure has a length substantially equal to a length of a respectively side of the seal ring.

15. The semiconductor structure of claim 11, wherein the second top metal pad of a first one of the plurality of serially connected test units is joined with the first top metal pad of a second one of the plurality of serially connected test units to form an integrated metal pad.

16. A semiconductor chip comprising:
a test structure extending along at least one edge of the semiconductor chip, the test structure comprising a plurality of test units, each comprising:
 a first bottom metal pad and a second bottom metal pad, wherein all first bottom top metal pads and all second bottom metal pads of the plurality of serially connected test units are in a single metallization layer;
 a top metal line, wherein the top metal line of each of the plurality of test units is in a different metallization layer than the top metal lines in all other ones of the plurality of test units, and the top metal line is a top-most feature of a respective one of the plurality of test units;
 a first vertical electrical path connecting the first bottom metal pad to a first end of the top metal line; and
 a second vertical electrical path connecting the second bottom metal pad to a second end of the top metal line;
two bumps on the semiconductor chip, wherein the plurality of test units is connected in series between the two bumps; and
a seal ring adjacent to the test structure.

17. The semiconductor chip of claim 16, wherein the two bumps are corner bumps.

18. The semiconductor chip of claim 16, wherein the test structure comprises a side parallel to a side of the seal ring.

19. The semiconductor chip of claim 16, wherein the test structure comprises a closed loop.

20. The semiconductor chip of claim 16, wherein the second bottom metal pad of a first one of the plurality of test units is joined with the first bottom metal pad of a second one of the plurality of test units to form an integrated metal pad.

* * * * *